United States Patent [19]

Bruel et al.

[11] Patent Number: 4,704,302
[45] Date of Patent: Nov. 3, 1987

[54] PROCESS FOR PRODUCING AN INSULATING LAYER BURIED IN A SEMICONDUCTOR SUBSTRATE BY ION IMPLANTATION

[75] Inventors: Michel Bruel, Veurey; Jean du Port de Poncharra, St. Martin-Le-Vinoux, both of France

[73] Assignee: Commissariat a l'Energie Atomique, Paris, France

[21] Appl. No.: 898,870

[22] Filed: Aug. 20, 1986

Related U.S. Application Data

[63] Continuation of Ser. No. 721,289, Apr. 9, 1985, abandoned.

[30] Foreign Application Priority Data

Apr. 19, 1984 [FR] France .................. 84 06232

[51] Int. Cl.$^4$ ............................. B05D 3/06
[52] U.S. Cl. ................... 427/38; 156/662; 427/96; 427/376.2; 437/240
[58] Field of Search ............ 427/38, 85, 88, 96, 427/376.2; 156/662

[56] References Cited

U.S. PATENT DOCUMENTS 4,361,600 11/1982 Brown .................. 427/93
4,412,868 11/1983 Brown et al. ........... 148/1.5

FOREIGN PATENT DOCUMENTS 2410364 6/1979 France .

OTHER PUBLICATIONS

IBM Technical Disclosure Bulletin, vol. 26, No. 2, Jul. 1983.
Patent Abstracts of Japan, vol. 5, No. 1-3, E-71, 25.8.1981.
IEEE Transactions of Electron Devices, vol. ED-30, No. 11, Nov. 1983.

Primary Examiner—Bernard D. Pianalto
Attorney, Agent, or Firm—Pearne, Gordon, McCoy & Granger

[57] ABSTRACT

Process for producing a buried insulating layer in a semiconductor substrate by ion implantation.

This process consists of producing a mask on the substrate regions where the active zones are located, carrying out oxygen or nitrogen ion implantation in the substrate through the mask for the direct forming in the exposed area, and forming by lateral dispersion and diffusion into the substrate of implanted ions beneath the mask, a continuous oxide or nitride insulating layer which is buried in the substrate and optionally annealing the implanted substrate for reinforcing the continuity of the insulating layer by lateral diffusion of the implanted ions.

12 Claims, 4 Drawing Figures

PROCESS FOR PRODUCING AN INSULATING LAYER BURIED IN A SEMICONDUCTOR SUBSTRATE BY ION IMPLANTATION

This is a continuation of application Ser. No. 721,289, filed on Apr. 9, 1985, abandoned.

BACKGROUND OF THE INVENTION

The present invention relates to a process for producing an insulating layer buried in a semiconductor substrate by ion implantation. It more particularly applies to the field of producing MOS integrated circuits of the silicon on insulant type.

Silicon on insulant technology (SOI) provides a significant improvement compared with standard methods in which the active components of the integrated circuits are produced directly on a solid monocrystalline silicon substrate. The use of an insulating support leads to a marked reduction in the stray capacitances between the source and the substrate on the one hand and the drain and the substrate on the other of the active components of the circuits and consequently to an increase in the operating speed of said circuits. It also leads to a great simplification in the production processes, to an increase in the integration density, to an improved behaviour of the circuits at high voltages and to a limited sensitivity to radiation as a result of the small monocrystalline silicon volume. This technology also makes it possible to obtain monocrystalline silicon islands, which are isolated from one another and in which can be formed the different components of an integrated circuit.

One of the presently known SOI technologies is the silicon on sapphire or SOS technology, in which the components are produced in a thin silicon film epitaxied on a sapphire insulating substrate. This technology suffers from several disadvantages and in particular the cost of the sapphire substrate is high and the epitaxy of the thin silicon film on the substrate is difficult. In addition, the thin silicon film has a large number of defects due to its production process.

Other technologies have been investigated in order to obviate these disadvantages. Among these reference can be made to those involving the recrystallization of an amorphous or polycrystalline silicon film deposited on an amorphous substrate, such as of silicon oxide. The silicon is recrystallized by using lamps, lasers or heating elements making it possible to supply the heat necessary for melting the amorphous or polycrystalline silicon. Unfortunately said technology suffers from disadvantages linked more particularly with the poor quality of the silicon—insulant interface (e.g. parasitic channel at the interface).

Other technologies based on the a posteriori production of the insulating material, i.e. on the basis of solid monocrystalline silicon have been envisaged. Reference is e.g. made to the process of implanting high dose nitrogen or oxygen ions in solid monocrystalline silicon making it possible to form, following high temperature annealing of the substrate, a buried insulating silicon oxide or silicon nitride film. This process known as separation by Implanted Oxygen or SIMOX is in particular described in the article by P. L. F. Hemment et al in Nuclear Instruments and Methods 209/210, 1983, pp 157–164 entitled "Formation of buried insulating layers in silicon by the implantation of high doses of oxygen."

However, in this SIMOX process, the passage of the nitrogen or oxygen ions to a greater or lesser extent damages the monocrystalline silicon film surmounting the insulating layer and particularly in the regions of said silicon film in which will be formed the active zones of the active components of the integrated circuits. The defects produced are prejudicial to the obtaining of a satisfactory operation of the components.

SUMMARY OF THE INVENTION

The present invention relates to a process for producing a buried insulating layer in a semiconductor substrate, particularly of monocrystalline silicon making it possible to obviate the aforementioned disadvantages. Thus, this process, based on the ion implantation of oxygen or nitrogen ions in the semiconductor substrate, makes it possible to obtain a monocrystalline semiconductor layer surmounting a buried insulating layer, which is free from faults in the regions of the semiconductor layer in which will be produced the active zones of the components of the integrated circuits.

More specifically the present invention relates to a process for the production of a buried insulating layer in a semiconductor substrate in which will be formed the active zones of the active components of an integrated circuit, wherein it comprises the stages of producing a mask on the regions of the substrate in which the active zones will be formed and the ion implantation of oxygen or nitrogen in the substrate through the mask for forming, by lateral dispersion and diffusion in said substrate of the implanted ions, of a continuous insulating oxide or nitride layer buried in said substrate.

The masking of the substrate regions in which will be produced the active zones of the components of an integrated circuit makes it possible to prevent any deterioration of said active zones during ion implantation.

The term "active zone of a component" is understood to mean the channel zone of said component, i.e. that zone located below the gate thereof.

Advantageously following ion implantation the implanted substrate is annealed which, by lateral diffusion of the implanted ions, reinforces the continuity of the insulating oxide or nitride layer and, on the basis of the regions of the substrate in which the active zones will be produced, recrystallizes those parts of the substrate disturbed during ion implantation.

According to a preferred embodiment of the process of the invention, during ion implantation, the substrate is heated to a temperature of approximately 500° C., which facilitates the lateral diffusion of the implanted ions.

According to another preferred embodiment, ion implantation takes place with a high energy ion beam, i.e. having an energy between 200 and 1000 keV. Preferably said ion implantation is performed at a dose of several $10^{18}$ atoms/cm$^2$.

The process for producing a buried insulating layer according to the invention is advantageously used for producing an active component of an integrated circuit on an insulating support. In said application, the process of the invention comprises the stages of producing an oxide layer on the substrate constituting the gate oxide of the component, depositing a conductive layer on the gate oxide layer for producing the gate electrode of the component, depositing an insulating layer on the conductive layer, etching the insulating layer and then the conductive layer to produce the gate of the component, ion implantation of oxygen or nitrogen in the substrate for forming, by lateral dispersion and diffusion into said substrate of the implanted ions, a continuous insulating oxide or nitride layer buried in said substrate, the etched conductive layer and the etched insulating layer acting as a mask for said implantation and optionally annealing the implanted substrate which, by lateral diffusion of the implanted ions, reinforces the continuity of the insulating oxide or nitride layer buried in said substrate.

The high temperature annealing also ensures a lateral recrystallization of the substrate damaged by the passage of the ions, the active zone of the component beneath the gate acting as a starting nucleus or seed for said recrystallization.

According to a preferred embodiment of said process, the active component gate is 0.5 to 5 µm long.

Advantageously the semiconductor substrate is of monocrystalline silicon.

In the application of the process according to the invention to the production of an active component, the insulating layer is advantageously made from silicon oxide or silicon nitride.

BRIEF DESCRIPTION OF THE DRAWINGS

The invention is described in greater detail hereinafter relative to non-limitative embodiments and with reference to the attached drawings, wherein show.

DESCRIPTION OF THE PREFERRED EMBODIMENTS

The following description relates to a process for the production of an insulating layer buried in a monocrystalline silicon insulating layer for producing a MOS transistor of an integrated circuit of the silicon on insulant type. However, the invention obviously has much more general applications.

Figure 1:
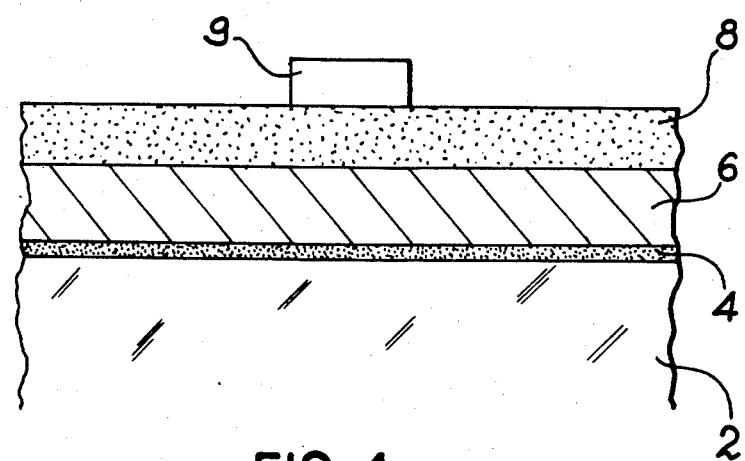
FIGS. 1 to 3 diagrammatically and in longitudinal section the different stages of the process for producing a buried insulating layer in a semiconductor substrate according to the invention.

As shown in FIG. 1, an oxide layer 4 is firstly produced on a monocrystalline silicon semiconductor substrate 2. Layer 4 can be obtained by thermal oxidation of the substrate at a temperature of approximately 900° C. Oxide layer 4, which is e.g. 300 Å thick, constitutes the gate oxide of a MOS transistor to be subsequently produced.

On said oxide layer 4 is then deposited a conductive layer 6 in which the gate electrode of the transistor will be produced. Conductive layer 6 e.g. has a thickness of 0.4 µm and can be produced from doped polycrystalline silicon. Layer 6 is e.g. deposited by vapour phase chemical deposition at low or non-low pressure.

A preferably silicon oxide or silicon nitride insulating layer 8 is then deposited on conductive layer 6. Insulating layer 8, whose thickness is a function of the implantation energy, can be obtained by vapour phase chemical deposition at low or non-low pressure.

Following the deposition of insulating layer 8, a resin mask 9 is produced thereon by a conventional microlithography process and this defines the dimensions of the transistor gate and particularly its length, which is preferably between 0.5 and 5 µm.

Figure 2:
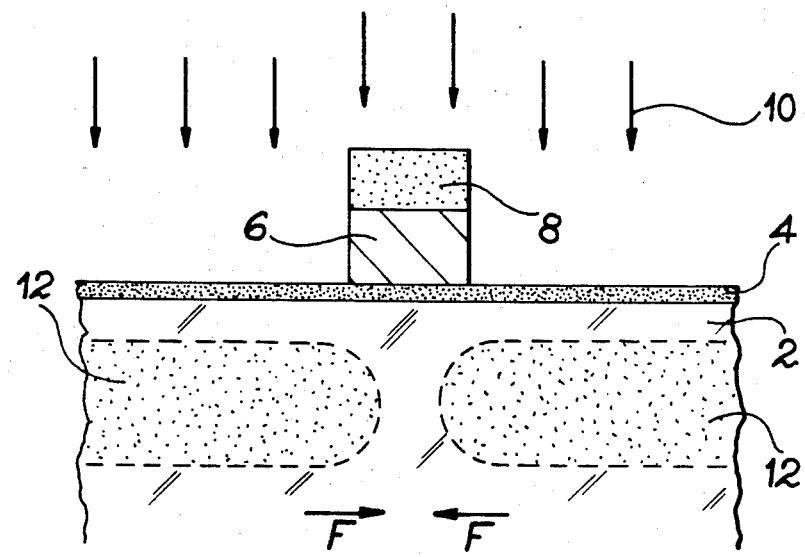

As shown in FIG. 2, insulating layer 8 is etched, followed by the etching of conductive layer 6 for producing the transistor gate. These etching operations can be performed successively or simultaneously, i.e. by a reactive ionic etching process using e.g. sulphur hexafluoride ($SF_6$) as the etching agent.

Following the etching processes and the elimination of mask 9, e.g. by chemical etching, oxygen or nitrogen ions are implanted in the semiconductor substrate 2. The etched insulating and conductive layers 6, 8 acting as a mask for said implantation prevent any deterioration of the active zone of the transistor (channel zone) during implantation. This ion implantation 10 is preferably carried out with an ion beam with an energy between 200 and 1000 keV and with a high dose, i.e. between $10^{18}$ and $3.10^{18}$ atoms/cm². It is thus possible to obtain insulating regions 12 in substrate 2. Said insulating regions 12 are formed from silicon oxide when an oxygen ion implantation is used and silicon nitride for a nitrogen ion implantation.

Figure 3:
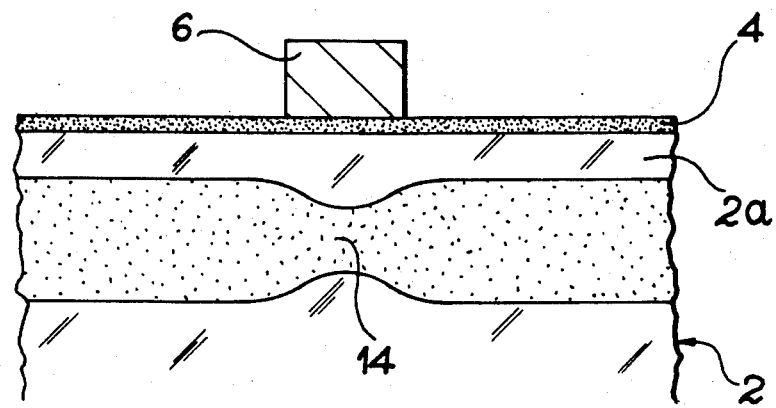

As the transistor gate formed in conductive layer 6 has a relatively limited length ($\leqq 5$ µm), use is made of the lateral spread phenomenon, i.e. lateral dispersion and diffusion into the substrate of the implanted oxygen or nitrogen ions, indicated by arrows F in FIG. 2, for obtaining a buried insulating layer 14 in substrate 2, cf FIG. 3.

To facilitate the diffusion of the implanted ions into the substrate, during implantation it is advantageous to heat the substrate to a moderate temperature of e.g. about 500° C.

After ion implantation and elimination of the etched insulating layer 8, e.g. by reactive ionic etching with $SF_6$, the implanted substrate can be annealed and this reinforces the continuity of the buried insulating layer 14 by diffusion of the implanted oxygen or nitrogen ions. Moreover, said annealing ensures a certain recrystallization of the zones of the substrate damaged during ion implantation, so that the faults are made good and their electrical quality is improved, the active zone of the component not disturbed by the implantation using the mask (etched insulating and conductive layers 8, 6) acting as a nucleus or seed for said recrystallization. Annealing is e.g. performed at high temperature, i.e. between 1000° and 1200° C. and e.g. 1100° C.

The obtaining of a buried insulating layer 14 by lateral spreading of the implanted ions (FIG. 2) and the diffusion thereof during annealing is dependent on the energy of the implanted ions. Moreover, the depth at which said insulating layer is produced, as well as its thickness are dependent on said energy.

The following table gives the average depth $R_p$ in µm of the concentration maximum of the oxygen and nitrogen ions implanted in a monocrystalline silicon substrate, as well as the standard variation $\Delta R_p$ in µm, as a function of the energy levels in keV used for the implantation.

TABLE

| Energy (keV) | O⁺/Si | | N⁺/Si | |
| --- | --- | --- | --- | --- |
| | $R_p$ (µm) | $\Delta R_p$ (µm) | $R_p$ (µm) | $\Delta R_p$ (µm) |
| 200 | 0.5 | 0.12 | 0.46 | 0.09 |
| 400 | 1 | 0.17 | 0.88 | 0.13 |
| 600 | 1.46 | 0.21 | 1.3 | 0.16 |
| 800 | 1.9 | 0.25 | 1.68 | 0.18 |
| 1000 | 2.33 | 0.27 | 2.1 | 0.2 |

The dielectric continuity beneath the active zones can be obtained by using a gate with a length of up to about 5 µm.

Figure 4:
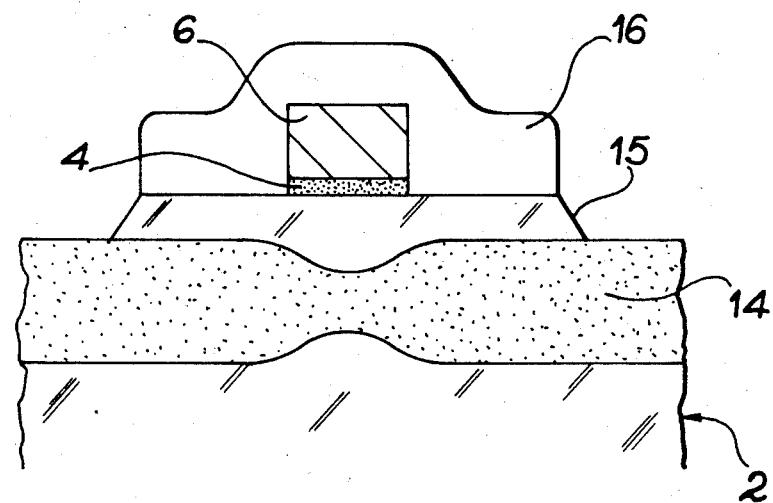
FIG. 4 diagrammatically and in longitudinal section the production of semiconductor islands on an insulating layer obtained according to the process of the invention.

The formation of a buried insulating layer 14 in the monocrystalline semiconductor substrate 2 according to the invention makes it possible to obtain a monocrystalline silicon layer 2a surmounting the insulating layer 14, which is free from defects at the active zones of the MOS components to be subsequently produced. As shown in FIG. 4, it is then possible to produce in said monocrystalline semiconductor layer 2a, moncrystalline silicon islands 15, which are isolated from one another. These islands can be obtained in a conventional manner, particularly by etching the monocrystalline layer 2a using an appropriate mask such as 16. The various active components of the integrated circuit can be produced in the monocrystalline islands in a conventional manner.

What is claimed is:

1. A process for the production of a buried insulating layer in a semiconductor substrate in which the active zones of the active components of an integrated circuit have been defined, wherein it comprises the steps of:
   producing a mask on the substrate to define said active zones, said active zones being equal to or less than 5 $\mu$m wide;
   ion implanting oxygen or nitrogen in the substrate through the mask, whereby the masked area is protected from implant damage, the dose of said implantation being greater than or equal to $10^{18}$ atoms/cm$^2$; and
   heating said substrate during implantation to form, by lateral dispersion and diffusion in said substrate of the implanted ions, a continuous insulating oxide or nitride layer buried in said substrate under said masked area as well as in the unmasked area.

2. A process according to claim 1, wherein following ion implantation the implanted substrate is annealed which, by lateral diffusion of the implanted ions, reinforces the continuity of the insulating oxide or nitride layer and, acting as seeds, the undamaged regions of the substrate, constituting the active zones, recrystallizes those parts of the substrate disturbed during ion implantation.

3. A process according to claim 1, wherein the active zones are 0.5 to 5 $\mu$m long.

4. A process according to claim 1, wherein ion implantation is performed with an ion beam with an energy varying between 200 and 1000 keV.

5. A process according to any one of the claims 1 to 4, wherein ion implantation is performed at a dose between $10^{18}$ and $3.10^{18}$ atoms/cm$^2$.

6. A process for producing a buried insulating layer for producing an active component of an integrated circuit on an insulating support, wherein it comprises the steps of:
   producing an oxide layer on the substrate constituting the gate oxide of the component;
   depositing a conductive layer on the said oxide layer for producing the gate electrode of the component;
   depositing an insulating layer on the conductive layer;
   etching the insulating layer and then the conductive layer to produce the gate of the component, the width of said gate being less than or equal to 5 $\mu$m;
   ion implanting oxygen or nitrogen in the substrate, the dose of said implantation being greater than or equal to $10^{18}$ atoms/cm$^2$; and
   heating said substrate during implantation to form, by lateral dispersion and diffusion into said substrate of the implanted ions, a continuous insulating oxide or nitride layer buried in said substrate, the etched conductive layer and the etched insulating layer acting as a mask during said implantation, said oxide or nitride layer being formed under said gate as well as in the unmasked area.

7. A process according to claim 1 or claim 6, wherein the substrate is made from monocrystalline silicon.

8. A process according to claim 7, wherein the conductive layer is a polycrystalline silicon layer.

9. A process according to claim 7, wherein the insulating layer is a silicon oxide or silicon nitride layer.

10. A process according to claim 6, wherein following ion implantation the implanted substrate is annealed which, by lateral diffusion of the implanted ions, reinforces the continuity of the insulating oxide or nitride layer and, acting as seeds, the undamaged regions of the substrate, constituting the active zones, recrystalizes those parts of the substrate disturbed during ion implantation.

11. A process according to claim 2 or 10, wherein annealing is performed at a temperature of 1000° to 1200° C.

12. A process according to claim 6, wherein the gate is 0.5 to 5 $\mu$m long.

* * * * *

UNITED STATES PATENT AND TRADEMARK OFFICE
CERTIFICATE OF CORRECTION

PATENT NO. : 4,704,302

DATED : November 3, 1987

INVENTOR(S) : Bruel et al.

It is certified that error appears in the above-identified patent and that said Letters Patent is hereby corrected as shown below:

Column 6, lines 1 and 2, claim 5, delete "any one of the claims 1 to 4" and insert --claim 1--.

Signed and Sealed this

Thirteenth Day of September, 1988

Attest:

DONALD J. QUIGG

*Attesting Officer*   *Commissioner of Patents and Trademarks*